United States Patent
Schledz et al.

(10) Patent No.: US 10,250,212 B2
(45) Date of Patent: Apr. 2, 2019

(54) RADIO FREQUENCY DEVICE

(71) Applicant: Infineon Technologies AG, Neubiberg (DE)

(72) Inventors: Ralf-Rainer Schledz, St. Margarethen (AT); Vjekoslav Matic, Stattegg (AT); Peter Solyom, Attendorf (AT)

(73) Assignee: Infineon Technologies AG (DE)

( * ) Notice: Subject to any disclaimer, the term of this patent is extended or adjusted under 35 U.S.C. 154(b) by 11 days.

(21) Appl. No.: 15/624,025

(22) Filed: Jun. 15, 2017

(65) Prior Publication Data

US 2017/0366155 A1 Dec. 21, 2017

(30) Foreign Application Priority Data

Jun. 16, 2016 (DE) .................. 10 2016 111 072

(51) Int. Cl.
| | |
|---|---|
| *H03F 1/56* | (2006.01) |
| *H03H 7/01* | (2006.01) |
| *H03F 3/19* | (2006.01) |
| *H03F 3/21* | (2006.01) |
| *H03H 7/38* | (2006.01) |
| *H04B 1/40* | (2015.01) |
| *H03H 1/00* | (2006.01) |
| *H04B 1/04* | (2006.01) |

(52) U.S. Cl.
CPC .......... *H03H 7/0115* (2013.01); *H03F 1/565* (2013.01); *H03F 3/19* (2013.01); *H03F 3/21* (2013.01); *H03H 1/00* (2013.01); *H03H 7/38* (2013.01); *H04B 1/0458* (2013.01); *H04B 1/40* (2013.01); *H03F 2200/171* (2013.01); *H03F 2200/387* (2013.01); *H03F 2200/451* (2013.01); *H03H 2001/0092* (2013.01)

(58) Field of Classification Search
CPC .... H03F 1/565; H03F 3/191; H03F 2200/222; H03F 2200/318; H03F 1/56; H03F 3/19; H03F 3/21; H03F 3/16; H03F 3/193; H03F 3/1935; H03H 7/0115; H03H 7/38; H04B 1/40
USPC ......................................... 330/302
See application file for complete search history.

(56) References Cited

U.S. PATENT DOCUMENTS

| | | | |
|---|---|---|---|
| 5,530,411 A | 6/1996 | Nakata et al. | |
| 6,384,688 B1 * | 5/2002 | Fujioka ................... | H03F 3/193 330/302 |
| 7,138,872 B2 * | 11/2006 | Blednov ............. | H01L 23/5222 330/302 |
| 7,741,907 B2 * | 6/2010 | Takagi .................... | H03F 3/217 330/251 |
| 8,299,857 B2 * | 10/2012 | Keshishian ............. | H03F 1/565 330/302 |
| 8,649,738 B2 * | 2/2014 | Takahashi ............... | H03F 3/189 330/302 |
| 9,203,358 B2 * | 12/2015 | Kamiyama ............. | H01L 23/66 |
| 2007/0057731 A1 * | 3/2007 | Le ............................. | H03F 1/56 330/302 |

OTHER PUBLICATIONS

Coilcraft, "Measuring Self Resonant Frequency", Document 363-1. Cary, Illinois: Sep. 16, 2003 (revised), pp. 1-4.

* cited by examiner

*Primary Examiner* — Khanh V Nguyen
(74) *Attorney, Agent, or Firm* — Design IP

(57) ABSTRACT

Radio frequency devices and methods are provided where a network like a filter network or impedance matching network comprises a series connection of at least two inductors.

20 Claims, 3 Drawing Sheets

RADIO FREQUENCY DEVICE

FIELD

The present application relates to radio frequency devices and methods and devices for designing such radio frequency devices.

BACKGROUND

Radio frequency devices and circuits are used in a variety of applications, for example in communication devices. In such radio frequency (RF) devices, impedance matching networks and/or filters are frequently used which may be implemented with so-called lumped elements, i.e. discrete inductors, capacitors and other passive elements.

Such filters are for example used to remove spurious components such as harmonics of a base frequency, e.g. a carrier frequency, and intermodulation products from an RF signal. For example, modern RF power amplifiers may use high speed semiconductors which generate such spurious components in addition to a wanted carrier signal.

For example, in order to comply with regulatory standards, a level of unwanted emissions due to such spurious components originating from RF transmitters must be reduced below a certain threshold. Such thresholds may for example be specified in regional or country specific regulatory standards.

The filter transfer function of such a filter, i.e. the attenuation of the filter over frequency, depends on frequency responses of individual components, in particular inductors and capacitors.

Inductors are usually manufactured as coils. There are several different coil manufacturing technologies, but all are facing a common problem—with increasing frequency of signals applied to the inductors the quality factor (Q-factor) of the coil decreases, and, above a certain critical frequency, the inductance value of the inductor decreases abruptly. Such a degradation of inductance directly affects the effectiveness of filters and impedance matching networks using such inductors, which in some cases may lead to an insufficient attenuation of high order harmonics and other spurious effects of a RF signal. Such problems have become more relevant in recent years as frequencies of RF circuits increased, for example into the Gigahertz (GHz) range.

As a characteristic of discrete elements like inductors, resistors and capacitors usually data about the components behavior over a frequency range is given, specifying the so-called equivalent series resonant frequency (SRF). For a given type of coils and technology, the SRF value increases when decreasing nominal inductance value. A significant degradation of the Q-factor and decrease of the inductance as mentioned above may take place even before reaching the SRF, which limits the inductor effectiveness for rejection of high order harmonics in filters and matching networks.

Therefore, it may be desirable to provide one or more RF filters and/or impedance matching networks that may reduce or mitigate the above-mentioned problems.

SUMMARY

Embodiments relate to radio frequency devices and methods and devices for designing such radio frequency devices.

According to one or more embodiments, a radio frequency device includes a radio frequency circuit including a terminal, a network coupled to the terminal, the network including a series connection of at least two inductors, and connections between the at least two inductors forming the series connection being exclusive between the at least two inductors.

According to one or more embodiments, a method includes designing a radio frequency network including a first inductor, and splitting the first inductor into a series connection of at least two second inductors to adjust a resonance frequency. The method may further be implemented by a computer program.

According to one or more embodiments, a computer readable storage medium includes computer-executable instructions that in response to execution, cause a computer system to perform a method, the method includes designing a radio frequency network including a first inductor, and splitting the first inductor into a series connection of at least two second inductors to adjust a resonance frequency. The method may further be implemented by a computer program.

DETAILED DESCRIPTION

In the following, various embodiments will be described in detail referring to the attached drawings. These embodiments are to be taken as examples only and are not to be construed as limiting. For example, while embodiments may be described comprising various features and details, in other embodiments some of these features or details may be omitted, and/or may be replaced by alternative features. Furthermore, apart from the features explicitly described, additional features, for example components or circuits conventionally used in radio frequency (RF) devices, may be provided.

Features from different embodiments may be combined with each other unless noted otherwise. Variations and modifications described with respect to one of the embodiments may also be applicable to other embodiments.

In the described embodiments, any direct connection or coupling between components, i.e. connections or couplings without intervening elements (for example metal layers or simply wire connections) may also be replaced by indirect connections or couplings comprising one or more additional intervening elements and vice versa, as long as the general purpose of the connection or coupling, for example to transmit a certain kind of signal, to transmit a certain kind of information or to provide a certain kind of control, is essentially maintained.

Some embodiments relate to radio frequency (RF) devices. In the context of the present application, radio frequency may refer to frequencies above 100 MHz, for example above 1 GHz. RF devices generate, process and/or receive such RF signals.

In some embodiments, as will be explained below in detail, series connections of inductors are used instead of single inductors to improve behavior at high frequencies of filter networks and/or impedance matching networks in RF devices. In particular, by providing a series connection of inductors, in embodiments a parasitic capacitance may be reduced compared to the use of single inductors. In such a series connection, in embodiments connections between the at least two inductors forming the series connection are exclusive between the inductors, i.e. there are no branch-offs or the like at nodes between the inductors. In the following, the term "series connection" is used in this sense.

Figure 1:
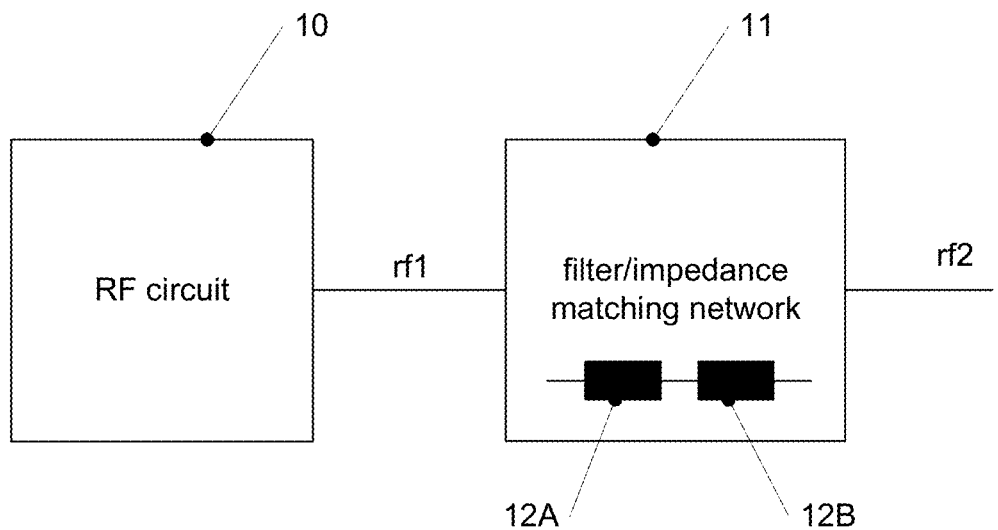
FIG. 1 is a block diagram illustrating a radio frequency device according to one or more embodiments.

Turning now to the figures, FIG. 1 shows a block diagram of an RF device according to an embodiment.

The RF device of FIG. 1 comprises an RF circuit 10. A terminal of RF circuit 10 is coupled to a filter/impedance matching network 11. In some embodiments, filter/impedance matching network 11 may be coupled to an output terminal of RF circuit 10. In such embodiments, RF circuit 10 generates a radio frequency signal rf1 at the output terminal. In some embodiments, RF circuit 10 may comprise an RF power amplifier to output signal rf1. In some embodiments, RF circuit 10 may be a communication circuit or part thereof, but is not limited thereto. For example, RF circuit 10 may comprise or be part of a wideband communication circuit.

RF signal rf1 may, besides wanted components at a wanted radio frequency, also unwanted components, for example higher harmonics of the wanted frequency or intermodulation products. To remove such unwanted components, and to provide impedance matching, signal rf1 is provided to a filter/impedance matching network 11. Network 11 outputs then a filtered/impedance matched RF signal rf2, for example to a load.

In other embodiments, filter/impedance matching network 11 may be coupled to an input terminal of RF circuit 10. In such embodiments, filter/impedance matching network 11 may receive signal rf2, provide filtering/impedance matching to signal rf2 (e.g. remove unwanted components) and provide signal rf1 to the input terminal of RF circuit 10. It should be noted that in other embodiments, filter/impedance matching networks may be coupled to both input and output terminals of an RF circuit.

Filter/impedance matching network 11 in some embodiments may be a passive network, for example a network comprising inductors, capacitors and/or resistors. In some embodiments, a filtering function and an impedance matching function may be provided in a single network. In other embodiments, separate networks or circuit portions may be provided for filtering and impedance matching. In yet other embodiments, only a filter network or only an impedance matching network may be provided.

In the embodiments of FIG. 1, filter/impedance matching network 11 comprises at least one series connection of two inductors 12A, 12B. In some embodiments, the inductors 12A, 12B may be implemented as coils. While a series connection of two inductors 12A, 12B is illustrated in FIG. 1, in other embodiments, series connections of more than two inductors may be used. In some embodiments, through the use of a series connection of inductors, a parasitic capacitance may be decreased and/or a series resonance frequency may be increased compared to the use of a single inductor having the same nominal inductance. "Nominal inductance" as used herein refers to the inductance which is present in an ideal case, e.g. without parasitic capacitances and parasitic resistances. However, as in real implementations of inductors some parasitic capacitances and/or resistors and also some manufacturing tolerances are present, a real inductance may deviate from the nominal inductance in particular for higher frequencies.

This effect of series connections of inductors in RF devices will now be explained in more detail referring to FIGS. 2-4.

Figure 2:
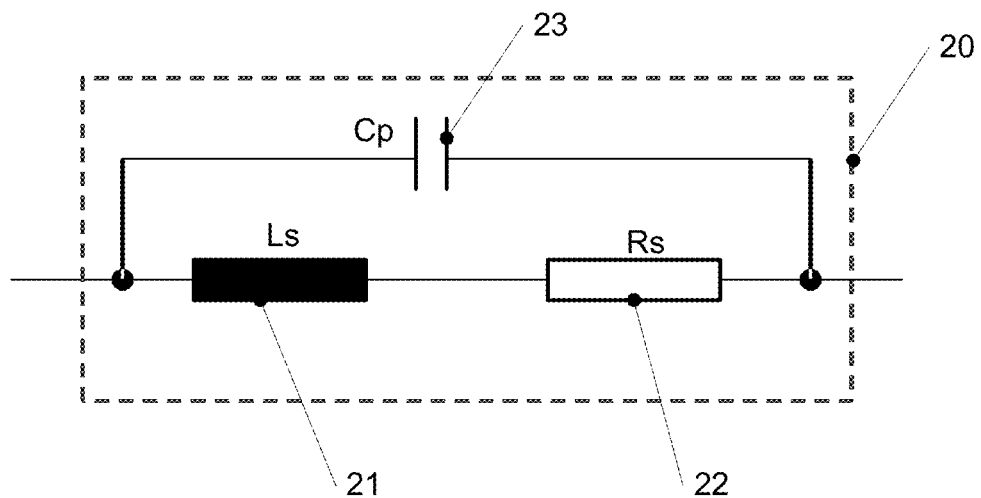
FIG. 2 illustrates a simple equivalent circuit of an inductor according to one or more embodiments.

FIG. 2 illustrates an equivalent (lumped element) circuit of an inductor 20 implemented for example as a coil. The equivalent circuit of FIG. 2 illustrates an approximation of a real coil, which is sufficient to illustrate some principles underlying some embodiments. In FIG. 2, inductor 20 is represented as comprising an ideal inductor 21 having an inductance Ls coupled in series with a resistor 22 having a resistance value Rs. A capacitor 23 having a capacitance Cp is coupled in parallel to the series connection of inductor 21 and resistor 22. Resistor 22 and capacitor 23 represent parasitic resistances and capacitances, respectively. In case of an ideal inductor, only inductor 21 would be present. In other words, resistor 22 and capacitor 23 represent deviations of inductor 20 from an ideal inductor due to real implementation of the inductor.

The presence of capacitor 23 and resistor 22 essentially forms an LRC resonant circuit having a series resonant frequency as mentioned in the introductory portion. It should be noted that the series resonance frequency for coils of a same nominal value (same inductance value Ls) depends on constructive details of the coil such as technology (for example wire-wound, monolithic, planar) presence of ferro- dia- or paramagnetic core or absence of such a core and size as well as a multitude of secondary parameters as for instance the conductivity of the material and depth of radio frequency field penetration into the conductor used. For example, for RF inductors depending on implementation the series resonant frequency of typical inductors may be in a range from 1 GHz to 3 GHz.

Therefore, comparatively high resonance frequencies are obtainable, but coils having such properties are in many cases also expensive to manufacture. On the other hand, with increasing frequencies used in RF circuits higher resonance frequencies are required. For example, some coils have resonance frequencies about 1300 MHz, which may be insufficient for some applications.

Therefore, in embodiments a single inductor (e.g. coil) is replaced by a series connection of two or more inductors (e.g. coils) having the same overall nominal inductance as a single inductor replaced thereby.

Figure 3:
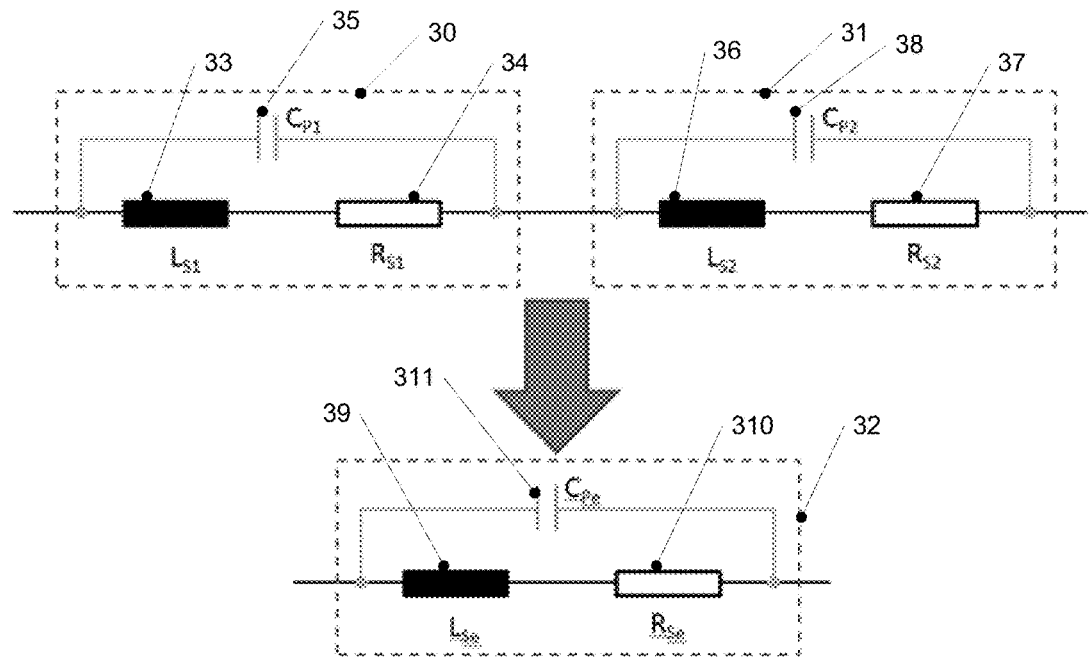
FIG. 3 is a diagram illustrating the effect of a series connection of inductors used in one or more embodiments.

FIG. 3 in a upper part illustrates a series connection of two real inductors 30, 31. Each inductor 30, 31 is represented by an equivalent circuit similar to the one illustrated in FIG. 2. In particular, inductor 30 is illustrated as comprising an ideal inductor 32 with an inductance Ls1 coupled in series to a resistor 34 having a resistance Rs1 and a parallel capacitor 35 having a capacitance value Cp1. In a similar manner, inductor 31 is represented as comprising an ideal inductor 36 having an inductance Ls2, a resistor 37 having a resistance Rs2 and a capacitor 38 having a capacitance Cp2. Ideal inductors 33, 36 represent the ideal configuration of inductors 30, 31, respectively, while resistors 34 and 37 as well as capacitors 35 and 38 represent parasitic effects.

The sum of inductance values Ls1 and Ls2 corresponds to a desired inductance for the series connection of inductors. The series connection may be represented as an inductor 32 shown in the lower part of FIG. 3 comprising an ideal inductor 39 having an inductance Lse, a resistor 310 having a resistance Rse and a parallel capacitor 311 having a capacitance value Cpe. Lse is at least approximately equal Ls1+Ls2 (series connection of inductors), Rse is approximately equal to Rs1+Rs2 (series connection of resistors), and 1/Cpe is approximately equal to 1/Cp1+1/Cp2 (series connection of capacitances). Therefore, through the series connection, the overall parasitic capacitance is reduced as a series of two capacitances. Consequently, the series connection of two inductors leads to an arrangement having a lower parasitic overall capacitance while having essentially the same inductance compared to an arrangement having a single inductor. In some embodiments, a single coil is replaced by two coils having each about half (for example between 45% and 55%) of the inductance of the inductor to be replaced in a design of a filter or impedance matching network. In other words, inductivities of the two inductors may be approximately equal, e.g. within ±10% or ±5% of each other or from a target inductance value, although wider variations are also possible. In other embodiments, other partitionings may be used.

The effect of such partitioning as explained above will now be further illustrated with reference to FIG. 4 using simulation examples. Numerical values given in connection with this simulation example serve illustrative purposes only and are not to be construed as limiting, as numerical values like inductance values may vary according to implementation and needed inductance in a particular network.

Figure 4:
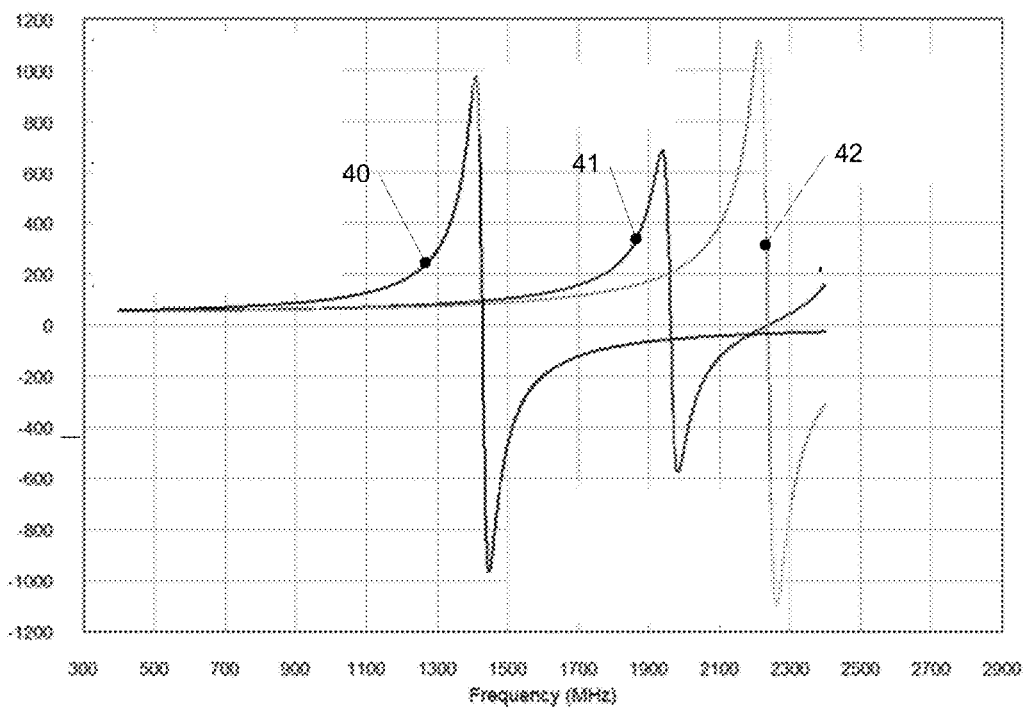
FIG. 4 are diagrams of frequency behavior of inductors to illustrate one or more embodiments.

FIG. 4 illustrates an equivalent inductance of various coil arrangements over frequency. Curve 40 illustrates the frequency behavior for one multilayer inductor of nominally 56 nH, curve 41 illustrates the behavior of two inductors connected in series, one inductor having a nominal inductance of 22 nH and the other inductor having a nominal inductance of 33 nH, and a curve 42 illustrates the frequency behavior of a series connection of two inductors each of nominally 27 nH coupled in series.

As can be seen, the effective inductance exhibits a high variation around the respective serial resonance frequencies. Furthermore, through the provision of a series connection instead of a single inductor, the resonance frequency is shifted significantly to higher frequencies (from about 1430 MHz for curve 40 to 1950 MHz (+36%) for curve 41 and to about 2150 MHz (+50%) for curve 42. In contrast, the inductance at low frequencies varied only slightly from the nominal value of a single inductor for the series connection (deviation of about 1.8% for curve 41 and about 3.6% for curve 42). Therefore, essentially the same effective inductance may be provided by the series connection, but the resonance frequency is shifted to significantly higher frequencies, such allowing the use of higher frequencies in RF circuits.

It should be noted that the increased number of components (two or more inductors instead of a single one) does not necessarily cause higher costs, for example standard coils manufactured with a cheaper technology may be used instead of one high quality coil in some embodiments. The inductors for the simulation were assumed to be implemented by a same technology.

Figure 5:
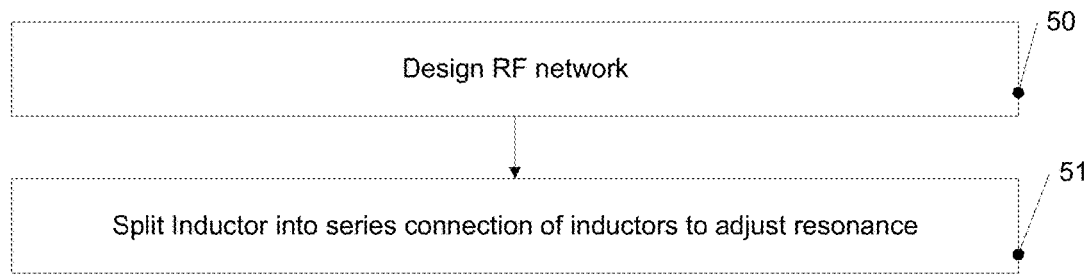
FIG. 5 is a flowchart illustrating a method according to one or more embodiments.

FIG. 5 illustrates a method for designing RF devices according to an embodiment. The method of FIG. 5 may be implemented within an otherwise conventional design flow for electronic circuits and semiconductor devices. For example, the method may be implemented as or as part of a circuit design computer program running on a conventional computing device including for example a processor and a memory and may for example be provided on a machine readable data carrier like a hard disk, a solid state disc, a digital versatile disc (DVD), a flash memory card or the like.

At 50, the method comprises designing a radio frequency network, for example as a filter network and/or impedance matching network like network 11 of FIG. 1.

At 51, the method comprises splitting an inductor of the RF network into a series connection of two or more inductors to adjust a resonance frequency to higher value and/or to be able to use cheaper inductor implementations.

The such designed RF network may then be implemented in a device.

Figure 6A:
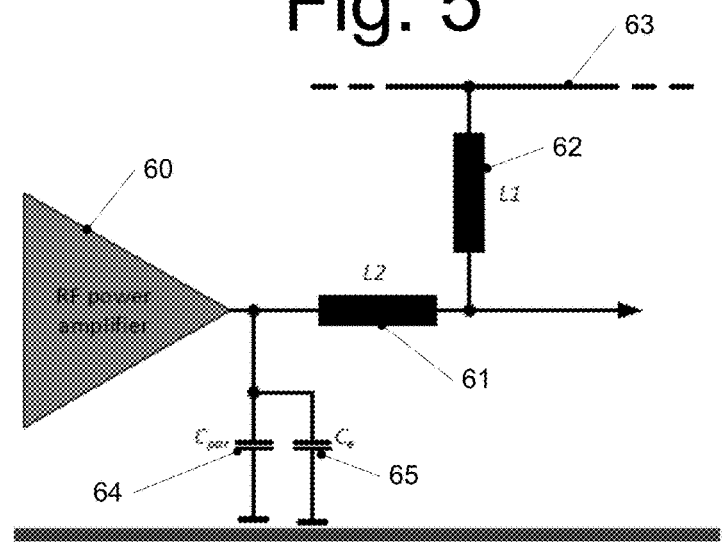
FIGS. 6A and 6B are circuit diagrams illustrating a radio frequency device according to one or more embodiments.
Figure 6B:
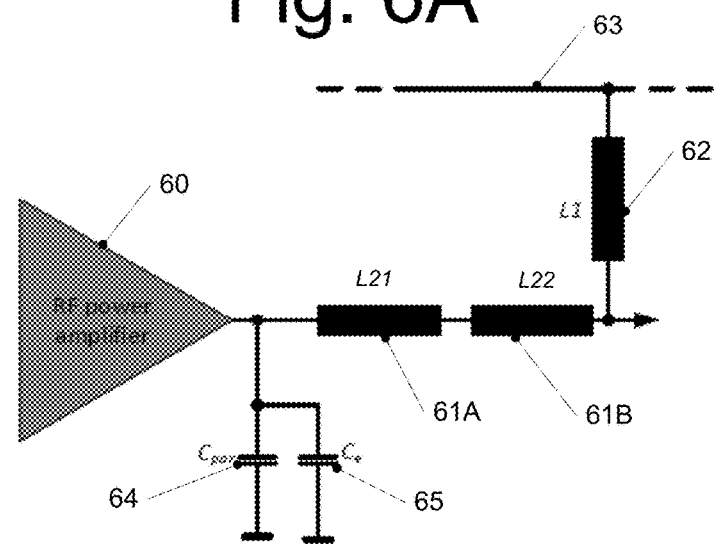

To further illustrate, FIG. 6 shows an RF device having an example RF network. To better illustrate the splitting of an inductor of 51 of FIG. 5, in particular FIG. 6A illustrates a conventional RF device, and FIG. 6B illustrates an RF device according to an embodiment.

In FIGS. 6A and 6B, like elements bear the same reference numerals and will not be described repeatedly.

The RF device of FIG. 6A includes an RF power amplifier 60 outputting an RF signal. A filtering/impedance matching network of the device of FIG. 6A comprises an inductor 61 having an inductance L2 coupled between an output of RF power amplifier 60 and an output node (symbolized by an arrow, signal is e.g. output to a next component of the impedance matching/filtering network or a load). Furthermore, the network comprises a DC feed coil 62 having an inductance L1 coupled between the output node and a supply voltage rail 63. Power amplifier 60 may also be supplied via supply voltage rail 63. Inductance L2 of inductor 61 may also include inductivities of bond wires, tracks and other parasitic inductivities. Inductor 61 may comprise a coil.

It is to be noted that inductors 61, 62 do not form a series connection in the sense as used herein, i.e. a series connection where the connection between inductors 61, 62 is exclusive between the inductors, as the output node between conductors 61, 62 is tapped, and a signal tapped there is further processed (for example provided to a next component or a load).

Furthermore, the network of FIG. 6A comprises a capacitor 65 having a capacitance Ce coupled between an output of power amplifier 60 and ground. Capacitor 65 represents external capacitors, for example lumped element capacitors or distributed capacitors. Furthermore, a capacitor 64 having a capacitance value $C_{par}$ represents parasitic capacitances (including chip internal, i.e. of a chip of RF power amplifier 60, chip external capacitances including substrate stray capacitances).

In FIG. 6B, compared to FIG. 6A inductor 61 has been "split" into a series connection of two inductors 61A, 61B having inductance values L21, L22, respectively. The sum of L21 and L22 may be at least approximately equal to L2. Inductors 61A, 61B each may comprise a coil. Inductors 61A, 61B form a series connection in the sense as used herein, as the connection between inductors 61A, 61B is exclusive to the inductors without a signal being tapped in between.

By splitting inductor 61 into inductor 61A, 61B, an equivalent series resonance frequency may be increased, a parasitic capacitance may be reduced and/or cheaper coils may be used for manufacturing, as explained above.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer or an electronic circuit. In some embodiments, some one or more of the method steps may be executed by such an apparatus.

Depending on certain implementation requirements, one or more embodiments provided herein can be implemented in hardware and/or in software. The implementation can be performed using a digital storage medium, for example a floppy disk, a DVD, a Blue-Ray, a CD, a ROM, a PROM, an EPROM, an EEPROM or a FLASH memory, having electronically readable control signals stored thereon, which cooperate (or are capable of cooperating) with a programmable computer system such that the respective method is performed. Therefore, the digital storage medium may be computer readable.

The above described exemplary embodiments are merely illustrative. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

What is claimed is:

1. A radio frequency device, comprising:
   a radio frequency circuit including a terminal and configured to generate an output signal;
   a network coupled to the terminal, the network comprising a series connection of at least two inductors; and
   connections between the at least two inductors forming the series connection being exclusive between the at least two inductors,
   wherein an equivalent resonance frequency of the series connection is equal to or greater than 1 GHz and is greater than a frequency of the output signal provided at an output of the radio frequency circuit.

2. The radio frequency device of claim 1, wherein the network is a passive network.

3. The radio frequency device of claim 1, wherein the network is an impedance matching network.

4. The radio frequency device of claim 1, wherein the network provides a filtering function.

5. The radio frequency device of claim 4, wherein the filtering function is adapted to remove unwanted frequency components from a signal at the terminal of the radio frequency circuit.

6. The radio frequency device of claim 1, wherein inductance values of the at least two inductors are substantially equal within ±10%.

7. The radio frequency device of claim 1, wherein the at least two inductors are implemented as coils.

8. The radio frequency device of claim 1, wherein the terminal is an output terminal of the radio frequency circuit.

9. The radio frequency device of claim 8, wherein the radio frequency circuit comprises a power amplifier, and wherein the output terminal is coupled to an output of the power amplifier.

10. A method comprising:
    designing a radio frequency network including a first inductor; and
    splitting the first inductor into a series connection of at least two second inductors to adjust a resonance frequency of the radio frequency network,
    wherein an equivalent resonance frequency of the series connection is equal to or greater than 1 GHz and is greater than a frequency of an output signal provided at an output of a radio frequency circuit.

11. The method of claim 10, wherein a sum of inductivities of the at least two second inductors is approximately equal to a nominal inductance of the first inductor.

12. The method of claim 10, wherein splitting the first inductor comprises splitting the first inductor into the at least two second inductors having substantially equal inductance values within ±10%.

13. The method of claim 12, wherein the inductance values of the second inductors are substantially equal within ±5%.

14. The method of claim 10, further comprising:
    implementing the radio frequency network in a radio frequency device.

15. A computer readable storage medium comprising computer-executable instructions that in response to execution, cause a computer system to perform a method comprising:
    designing a radio frequency network including a first inductor; and
    splitting the first inductor into a series connection of at least two second inductors to adjust a resonance frequency of the radio frequency network,
    wherein an equivalent resonance frequency of the series connection is equal to or greater than 1 GHz and is greater than a frequency of an output signal provided at an output of a radio frequency circuit.

16. The computer readable storage medium of claim 15, wherein a sum of inductivities of the at least two second inductors is approximately equal to a nominal inductance of the first inductor.

17. The computer readable storage medium of claim 15, wherein splitting the first inductor comprises splitting the first inductor into the at least two second inductors having substantially equal inductance values within ±10%.

18. The computer readable storage medium of claim 17, wherein the inductance values of the second inductors are substantially equal within ±5%.

19. A radio frequency device, comprising:
    a radio frequency circuit including an input terminal;
    a network coupled to the input terminal, the network comprising a series connection of at least two inductors and configured to receive a first radio frequency signal, generate a second radio frequency signal based on the first radio frequency signal fed through the series connection, and provide the second radio frequency signal to the input terminal of the radio frequency circuit; and
    connections between the at least two inductors forming the series connection being exclusive between the at least two inductors.

20. The radio frequency device of claim 19, wherein:
    the radio frequency circuit is configured to generate an output signal, and
    an equivalent resonance frequency of the series connection is equal to or greater than 1 GHz and is greater than a frequency of the output signal provided at an output of the radio frequency circuit.

* * * * *